US010079358B2

(12) United States Patent
Song et al.

(10) Patent No.: US 10,079,358 B2
(45) Date of Patent: Sep. 18, 2018

(54) ARRAY SUBSTRATE, METHOD FOR MANUFACTURING THE SAME, AND DISPLAY DEVICE

(71) Applicant: BOE TECHNOLOGY GROUP CO., LTD., Beijing (CN)

(72) Inventors: Young Suk Song, Beijing (CN); Seong Yeol Yoo, Beijing (CN); Seung Jin Choi, Beijing (CN); Hee Cheol Kim, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/103,222

(22) Filed: Dec. 11, 2013

(65) Prior Publication Data

US 2014/0159018 A1 Jun. 12, 2014

(30) Foreign Application Priority Data

Dec. 12, 2012 (CN) .......................... 2012 1 0537754

(51) Int. Cl.
*H01L 29/04* (2006.01)
*H01L 29/10* (2006.01)
(Continued)

(52) U.S. Cl.
CPC ............ *H01L 51/52* (2013.01); *H01L 27/322* (2013.01); *H01L 51/5262* (2013.01);
(Continued)

(58) Field of Classification Search
CPC . H01L 27/1214; H01L 27/12; H01L 51/0545; H01L 51/5271; B82Y 10/00
(Continued)

(56) References Cited

U.S. PATENT DOCUMENTS 5,294,288 A * 3/1994 Melpolder ............. G02B 5/201
257/E31.123
6,567,145 B1 * 5/2003 Kaneko ............. G02F 1/134363
349/139
(Continued)

FOREIGN PATENT DOCUMENTS

JP 2010-010020 A 1/2010
JP 2010-117398 A 5/2010
JP 2010-287543 A 12/2010

OTHER PUBLICATIONS

Gao et al, Thickness Dependence of Resistivity and Optical Reflectance of ITO Films, Chin. Phys. Lett. vol. 25, No. 4 (2008), pp. 1380-1383.*
(Continued)

*Primary Examiner* — Lex Malsawma
*Assistant Examiner* — Eric W Jones
(74) *Attorney, Agent, or Firm* — Ladas & Parry LLP

(57) ABSTRACT

Embodiments of the present invention disclose an array substrate comprising a base substrate and a plurality of pixel units disposed on the base substrate, the pixel unit comprising a transflective layer formed on the base substrate; a thin film transistor structure formed over the transflective layer; an organic light-emitting diode disposed in a pixel region of the pixel unit and driven by the thin film transistor structure, and in a direction away from the base substrate, the organic light-emitting diode sequentially comprising a first electrode that is transparent, an organic light-emitting layer and a second electrode for reflecting light; and a color filter, disposed between the second electrode of the organic light-emitting diode and the transflective layer; wherein the second electrode of the organic light-emitting diode and the transflective layer constitute a microcavity structure. Embodiments of the present invention also disclose a
(Continued)

method for manufacturing the array substrate and a display device including the above array substrate.

10 Claims, 4 Drawing Sheets

(51) Int. Cl.
  *H01L 31/00* (2006.01)
  *H01L 51/52* (2006.01)
  *H01L 27/32* (2006.01)
(52) U.S. Cl.
  CPC ...... *H01L 51/5265* (2013.01); *H01L 27/3206* (2013.01); *H01L 51/5271* (2013.01); *H01L 2227/323* (2013.01)
(58) Field of Classification Search
  USPC .................................. 257/40, 59; 27/40, 59
  See application file for complete search history.

(56) References Cited

U.S. PATENT DOCUMENTS

| | | | |
|---|---|---|---|
| 9,136,504 B2* | 9/2015 | Smith | H01L 51/5265 |
| 2003/0107326 A1* | 6/2003 | Park et al. | 315/169.3 |
| 2004/0263441 A1* | 12/2004 | Tanaka | G09G 3/325 |
| | | | 345/76 |
| 2005/0006652 A1* | 1/2005 | Pai | 257/79 |
| 2005/0140277 A1* | 6/2005 | Suzuki et al. | 313/504 |
| 2006/0267485 A1* | 11/2006 | Wood et al. | 313/504 |
| 2007/0222368 A1* | 9/2007 | Lee | H01L 51/5262 |
| | | | 313/503 |
| 2007/0296840 A1* | 12/2007 | Takada | H01L 27/14621 |
| | | | 348/272 |
| 2008/0024402 A1* | 1/2008 | Nishikawa | H01L 51/5209 |
| | | | 345/82 |
| 2009/0021676 A1* | 1/2009 | Kuo et al. | 349/114 |
| 2012/0098412 A1* | 4/2012 | Shin | H01L 51/5036 |
| | | | 313/498 |
| 2012/0168761 A1* | 7/2012 | Park et al. | 257/59 |
| 2012/0176423 A1* | 7/2012 | Nagato | G02F 1/133526 |
| | | | 345/690 |
| 2012/0268809 A1* | 10/2012 | Guo | G02F 1/216 |
| | | | 359/359 |
| 2012/0273822 A1* | 11/2012 | Ohsawa et al. | 257/98 |
| 2012/0286651 A1* | 11/2012 | Levermore et al. | 313/504 |

OTHER PUBLICATIONS

First Chinese Office Action Appln. No. 201210537754.1; dated Oct. 10, 2014.

Extended European Search Report dated Jul. 3, 2014; Appln. No. 13196859.6-1555.

* cited by examiner

ARRAY SUBSTRATE, METHOD FOR MANUFACTURING THE SAME, AND DISPLAY DEVICE

TECHNICAL FIELD

Embodiments of the present invention relate to a display technology field, particularly to an array substrate, a method for manufacturing the same, and a display device.

BACKGROUND

An Organic Light-Emitting Diodes (OLED) is considered as one of the most promising display technologies in the future for its advantages in simple manufacturing process, low cost, the ability adjustable color of its emitting light in the region of visible light, suitable for manufacturing a large size display device and the flexible and the like. Especially the white OLED (WOLED) has power efficiency over 60 lm/W and a lifetime of more than 20,000 hours, greatly promoting development of the WOLED.

As illustrated in FIG. 1 (a), a WOLED employs an organic light-emitting layer 102, the material of which is made up by mixing materials capable of emitting three primary colors of red, green and blue, so that the organic light-emitting layer 102 emits white light. The organic light-emitting layer 102 is disposed between a cathode 101 and an anode 103 so that the white light emitted by the organic light-emitting layer is reflected by the cathode 101 and then exit from a side of the anode 103. In order to improve transmittance and enhance brightness of the WOLED display device, a transflective layer 103' is displaced at one side of the anode corresponding to a region of a color filter of each color to form a microcavity structure between the transflective layer 103' and the cathode. As shown in FIG. 1(b), the microcavity structure refers to a structure formed between a reflective layer and a transflective layer with a thickness of micron scale and the principle of the microcavity structure to increase light intensity is that light rays can be continuously reflected between the reflective layer and the transflective layer, and due to resonance effect, in light finally exiting the transflective layer, light with a specific wavelength will be intensified, and the wavelength of light intensified is related to the thickness of the microcavity structure. In a WOLED display device, different pixel units are used for emitting light of different color, and thus microcavity structures in different pixel units should be able to intensify light of different wavelengths (color of which being the same as the one of the color filter corresponding to the microcavity structure), that is to say, microcavity structures of different pixel units have different thicknesses.

FIGS. 2 and 3 show diagrams of layer structures of two conventional WOLED array substrates. The color filter is located outside the microcavity structure. Based on the principle mentioned above, microcavity structures corresponding to color filters of each color have different thicknesses, such as the structure 300 in FIG. 2 and the structure 400 in FIG. 3. As lights of different colors have different wavelengths, the corresponding microcavity structures are not the same and have different thicknesses. For example, as shown in FIG. 3, Cathode is the cathode of the OLED, Anode is the anode of the OLED and an organic light emitting layer is disposed therebetween (the material thereof generally formed by mixing organic materials capable of emitting three primary colors RGB). R, G, B and W represent light exiting regions of red light, green light, blue light and white light respectively. Red CF, Green CF and Blue CF are color filters of red light, green light and blue light respectively. Microcavity structure of each color light comprises an IZO layer or an ITO layer disposed above an OC layer (a protective layer), further comprises a SiNx and SiOx (silicon nitride and silicon oxide) layer for R region, G region and B region, and further comprises an IZO/ITO layer in addition to the anode for R region and B region, with transmittance of corresponding color light increased after white light emitted by WOLED passes through the layers mentioned above. As shown in FIG. 4, the spot lines correspond to transmittance (i.e. brightness) without microcavity structure, and solid lines correspond to transmittance with microcavity structure. Transmittance of blue light is about 1.6 times of original value, transmittance of green light is about 2.5 times of original value and transmittance of red light is about 2.2 times of original value.

As can be seen from FIGS. 2 and 3, the existing microcavity structure increases light transmittance, however, layer structures of the existing microcavity structures are complicated and it is required to manufacture microcavity structures with different thicknesses for regions corresponding to color filters of each color so that the manufacturing processes are complicated.

SUMMARY

The technical problem to be solved by embodiments of present invention is how to obtain a microcavity structure using simple manufacturing process to increase transmittance of a WOLED display device.

To solve the above technical problems, embodiments of the present invention provide an array substrate comprising a base substrate and a plurality of pixel units disposed on the base substrate, each of the pixel unit comprising:

a transflective layer formed on the base substrate;

a thin film transistor structure formed over the transflective layer;

an OLED disposed in a pixel region of the pixel unit and driven by the thin film transistor structure, and in a direction away from the base substrate, the OLED sequentially comprising a first electrode that is transparent, an organic light-emitting layer and a second electrode for reflecting light; and a color filter disposed between the second electrode of the OLED and the transflective layer;

wherein the second electrode of the OLED and the transflective layer form a microcavity structure.

The thin film transistor structure comprises a switching thin film transistor and a driving thin film transistor, a drain electrode of the switching thin film transistor being connected to a gate electrode of the driving thin film transistor, a drain electrode of the driving thin film transistor being connected to the first electrode of the OLED.

According to an embodiment of the present application, the thin film transistor structure includes a first gate and a second gate formed over the base substrate, a gate insulation layer formed over the first gate and the second gate, a first active layer and a second active layer formed over the gate insulation layer and disposed over the first gate and the second gate respectively, a first source and a first drain formed over the first active layer, a second source and a second drain formed over the second active layer, the first drain being connected to the second gate, the first gate, the gate insulation layer, the first active layer, the first source and the first drain constituting a switching thin film transistor, the second gate, the gate insulation layer, the second active layer, the second source and the second drain constituting a driving thin film transistor;

the drain electrode of the driving thin film transistor being electrically connected to the first electrode of the OLED.

According to an embodiment of the present application, the transflective layer is formed in the pixel region of the pixel unit and in a gate electrode region of the thin film transistor structure; portions of the transflective layer corresponding to the gate electrode region of the thin film transistor structure are disposed under the gate electrode of the switching thin film transistor and the gate electrode of the driving thin film transistor, patterns of the portions of the transflective layer are consistent with patterns of the gate electrode of the switching thin film transistor and the gate electrode of the driving thin film transistor.

According to an embodiment of the present application, the transflective layer is formed on the base substrate, disposed in the pixel region of the pixel unit and in the gate region of the thin film transistor structure, a passivation layer is formed on the thin film transistor structure and over the transflective layer; the OLED is formed over the passivation layer, the second electrode of the OLED being a cathode, the first electrode being an anode and the first electrode being connected to the second drain electrode through via holes in the passivation layer, the color filters formed on the passivation layer and located in the pixel region of the pixel unit, the color filters of various colors have different thicknesses, the first electrode of the OLED located above the color filters.

According to an embodiment of the present application, a resin layer is further formed on the thin film transistor structure and on the color filters, the OLED is formed over the resin layer, and the first electrode connected to a drain electrode of the driving thin film transistor through via holes penetrating the passivation layer and the resin layer.

According to an embodiment of the present application, a pixel define layer is further formed over a region corresponding to the thin film transistor structure of the pixel units and over the first electrode.

The transflective layer is made of any one of silver, aluminum, molybdenum, copper, titanium, chromium and alloys thereof and has a transmittance in a range of 5% to 95%.

The transflective layer has a thickness in a range of 10 Å to 200 Å.

The color filter has a thickness in a range of 1000 Å to 40000 Å.

The color filters can be color filters of RGB (Red, Green and Blue) mode, RGBY (Red, Green, Blue and Yellow) mode or RGBW (Red, Green, Blue and White) mode.

Embodiments of the present invention also provide a method for manufacturing an array substrate, which comprising the following steps:

forming patterns of a transflective layer, a thin film transistor structure and a passivation layer on a base substrate to define a plurality of pixel units on the base substrate;

forming patterns of color filters in a pixel region of the pixel unit, color filters of different colors having different thicknesses;

forming an OLED in the pixel region of the pixel unit, the color filters disposed between the OLED and the transflective layer.

The step of forming patterns of a transflective layer, a thin film transistor structure and a passivation layer on a base substrate to define a plurality of pixel units on the base substrate comprising:

sequentially forming a transflective thin film and a gate metal thin film on the base substrate, and forming patterns of gate electrodes of the thin film transistor structure and the transflective layer through one patterning process;

sequentially forming other layer structures of the thin film transistor structure to form the thin film transistor structure;

forming a pattern of the passivation layer on the thin film transistor structure and on the color filters.

The step of forming patterns of color filters in the pixel region of the pixel unit so that color filters of different colors have different thicknesses comprises:

forming a film of color filter of one color on the passivation layer, forming a pattern of the color filter of this color in the pixel region through a patterning process and forming patterns of color filter of other colors sequentially in this manner, and the color filters of different colors having different thicknesses.

According to an embodiment of the present application, the step of forming an OLED in the pixel region of the pixel unit comprises:

forming via holes by etching the passivation layer through a patterning process;

forming a transparent conductive film on the color filters and forming a pattern of the first electrode of the OLED through a patterning process, the first electrode being connected to the thin film transistor structure through the via holes;

forming an insulation film on the passivation layer and on the first electrode and forming a pattern of the pixel define layer on a region corresponding to the thin film transistor and on the first electrode through a patterning process to define a position of the OLED to be formed in the pixel region;

forming an organic light-emitting layer on the first electrode and on the pixel define layer;

forming a second electrode of the OLED on the organic light-emitting layer, the second electrode used for reflecting light.

According to an embodiment of the present application, the method further comprises forming a resin layer after patterns of the transflective layer and the color filters are formed and before forming the OLED.

According to an embodiment of the present application, the step of forming the OLED in the pixel region of the pixel unit comprises:

forming via holes penetrating the resin layer and the passivation layer through a patterning process;

forming a transparent conductive film on the resin layer, and forming a pattern of a first electrode of the OLED through a patterning process, the first electrode being connected to the thin film transistor structure through via holes;

forming an insulation film on the resin layer and on the first electrode, and forming a pattern of a pixel define layer through a patterning process to define a position of the OLED to be formed in the pixel region;

forming an organic light-emitting layer on the first electrode and on the pixel define layer;

forming a second electrode of the OLED on the organic light-emitting layer, the second electrode used for reflecting light.

According to an embodiment of the present application, the transflective layer is made of any one of silver, aluminum, molybdenum, copper, titanium, chromium or alloys thereof and has a transmittance in a range of 5% to 95%.

According to an embodiment of the present application, the transflective layer has a thickness in a range of 10 Å to 200 Å.

According to an embodiment of the present application, the color filters have a thickness in a range of 1000 Å to 40000 Å.

Embodiments of the present invention also provide a display device comprising the array substrate mentioned above.

Embodiments of the present invention increase light transmittance by forming a transflective layer on a base substrate and forming a microcavity structure between the transflective layer and a reflective electrode (a cathode or an anode) of the OLED with the color filters inside the microcavity structure. For each pixel unit, as the color filters of a pixel unit of different colors are to be formed in different steps, thicknesses thereof can be easily controlled separately. Therefore, the array substrate of the present invention is easy to manufacture at low cost.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1:
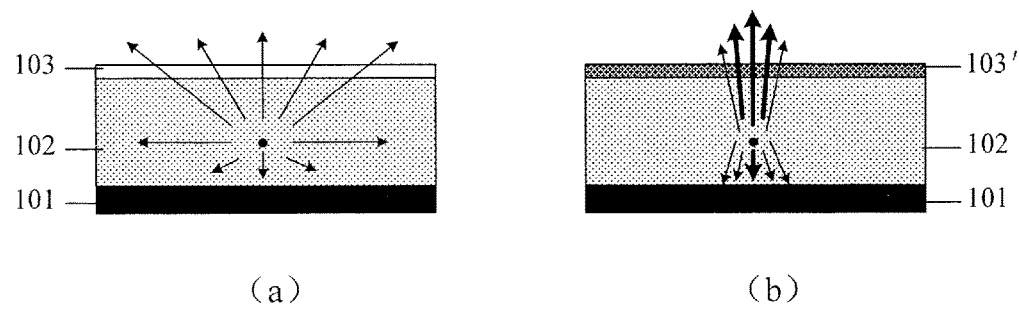
In FIG. 1 (a) is a diagram showing a conventional OLED without microcavity structure, (b) is a diagram showing the principle of the conventional microcavity structure.
Figure 2:
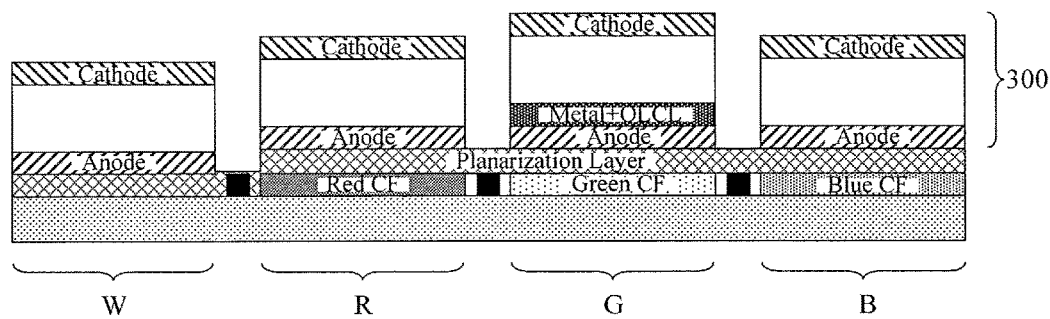
FIG. 2 is a diagram of one conventional WOLED array substrate structure with microcavity structure.
Figure 3:
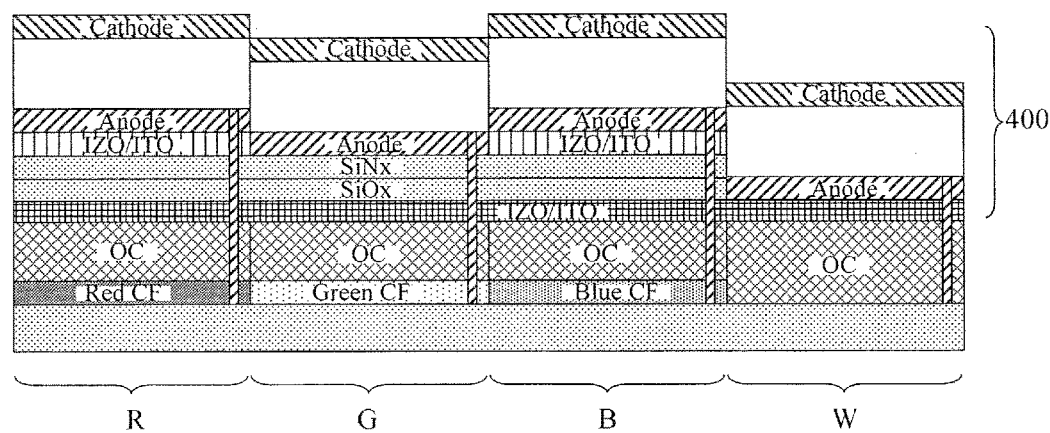
FIG. 3 is a diagram of another conventional WOLED array substrate structure with microcavity structure.
Figure 4:
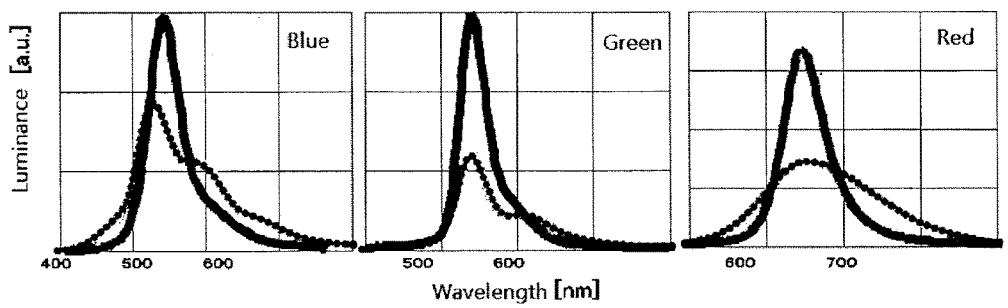
FIG. 4 shows a diagram of a comparing graph of transmittance with and without the microcavity structure.
Figure 5:
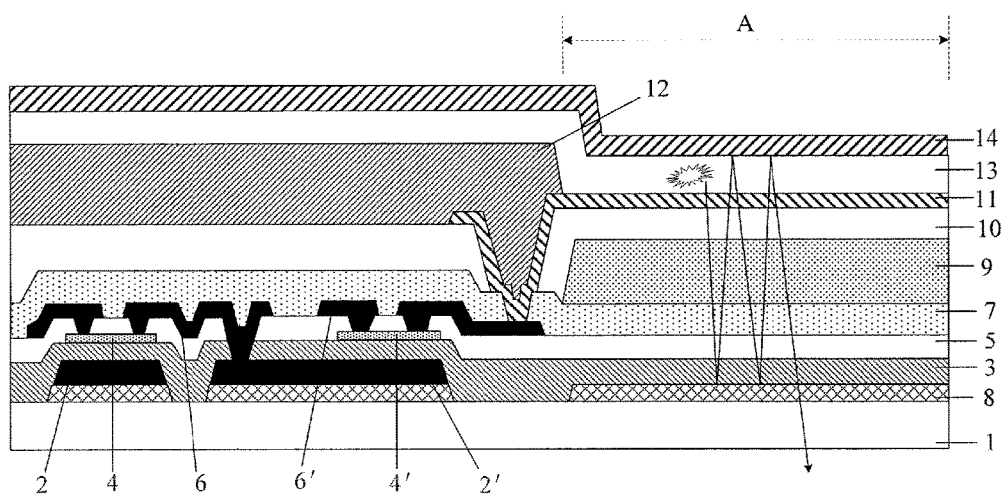
FIG. 5 is a structural diagram of an array substrate according to an embodiment of the present invention.

As illustrated in FIG. 5, an array substrate according to the present embodiment includes: a plurality of gate lines, data lines and pixel units defined by the gate lines and the data lines formed on a base substrate 1. Each of the pixel units comprises: a thin film transistor structure formed on the base substrate and an OLED driven by the thin film transistor structure, with the OLED disposed in a pixel region of the pixel unit (often referring to a display region outside a region of the thin film transistor structure), i.e., A region in FIG. 5 (the region outside the A region is the region of thin film transistor structure). The pixel unit also comprises a color filter 9. The OLED comprises in order in a direction away from the base substrate 1, a first electrode 11 which is transparent, an organic light-emitting layer 13 and a second electrode 14 for reflecting light.

To obtain a microcavity structure, the pixel unit of the array substrate according to the embodiment of the present invention further comprises a transflective layer 8. The transflective layer 8 is disposed on the base substrate 1, in the pixel region A of the pixel unit and in a gate region of the thin film transistor structure (as the transflective layer 8 and the gates are formed in one mask process during the manufacturing process). The color filter 9 is disposed between the second electrode 14 of the OLED and the transflective layer 8 and color filters of different colors have different thicknesses. A microcavity structure is formed between the second electrode 14 of the OLED and the transflective layer 8, wherein the color filter 9 is disposed inside the microcavity structure and between the second electrode 14 of the OLED and the transflective layer 8. Therefore, it is possible to adjust the thicknesses of the microcavity structure through controlling the thicknesses of the color filters 9; since the color filters of different colors are to be formed in different steps, thicknesses thereof can be easily controlled separately, without requiring manufacturing additional layers individually for a pixel of a certain color to control its thickness. Therefore, the array substrate according to embodiments of the present invention can be easily manufactured at low cost.

The thin film transistor structure, as shown in FIG. 5, comprises a first gate electrode 2 formed on the base substrate 1, a second gate electrode 2' and gate lines (not illustrated) (due to different manufacturing processes, there may be a transflective layer beneath the first gate electrode 2, the second gate electrode 2' and the gate lines and the patterns of the transflective layer is consistent with patterns of the first gate electrode 2 and the second gate electrode 2', as shown in FIG. 5); a gate insulation layer 3 formed over the first gate electrode 2, the second gate electrode 2' and the gate lines; a first active layer 4 and a second active layer 4' formed on the gate insulation layer 3; an insulation layer 5 formed on the first active layer 4 and the second active layer 4'; first source/drain layer 6 (including a first source electrode and a first drain electrode) and a second source/drain layer 6' (including a second source electrode and a second drain electrode) formed on the insulation layer 5; and a passivation layer 7 formed on the first source/drain layer 6 and the second source/drain layer 6'. The first gate electrode 2, the gate insulation layer 3, the first active layer 4, the insulation layer 5 and the first source/drain layer 6 constitute a switching thin film transistor, and the second gate electrode 2', the gate insulation layer 3, the second active layer 4', the insulation layer 5 and the second source/drain layer 6' constitute a driving thin film transistor, with the drain electrode of the switching thin film transistor being connected to the gate electrode 2' (the second gate) of the driving thin film transistor.

In the present embodiment, while the color filter 9 is formed on the passivation layer 7, the OLED is disposed over the transflective layer 8 and defined in the pixel region A by a pixel define layer (PDL) 12. In the present embodiment, the first electrode 11 is an anode, the second electrode 14 is a cathode (it may also be that the first electrode 11 is a cathode and the second electrode 14 is an anode) and the first electrode 11 is connected to the second drain electrode of the thin film transistor structure (i.e., the drain of the driving thin film transistor) through a via hole in the passivation layer 7. The second electrode 14 for reflecting light may be a reflective electrode made of a reflective material. The second electrode 14 may be coated with a reflective layer, thus a reflective electrode is formed.

The gate electrode of the switching thin film transistor (the first gate 2) is connected to the gate line, the source electrode of the switching thin film transistor (the first source) is connected to the data lines, the drain electrode of the switching thin film transistor (the first drain) is connected to the gate electrode of the driving thin film transistor (the second gate 2'), the source electrode of the driving thin film transistor (the second source) is connected to a power voltage, the drain electrode of the driving thin film transistor (the second drain) is connected to the first electrode 11 of the OLED. White light emitted by the white light organic light-emitting layer 13 exits from the substrate 1 after passing through the first electrode 11 and the underlying layers, as illustrated in FIG. 5. When white light is incident on the transflective layer 8, one portion of the light exits, the other portion of the light is reflected, reflected light will be incident on the second electrode 14 and will be reflected again, thus, reflected light is continuously reflected by the transflective layer 8 and the second electrode 14. Due to resonant effect, light of specific wavelength in light finally emitted from the transflective layer 8 will be intensified, so that transmittance of light with specific wavelength is increased.

To increase the spatial distance of the microcavity structure and further increase transmittance, a resin layer 10 is formed on the passivation layer and on the color filter 9 and disposed between the color filter 9 and the first electrode 11 (an anode), and the first electrode 11 is connected to the second drain electrode through a via hole penetrating the passivation layer 7 and the resin layer 10.

In the present embodiment, the transflective layer 8 has a transmittance within a range of 5% to 95%, is consisted of any one of silver, aluminum, molybdenum, copper, titanium, chromium or alloy of any two or more thereof; the transflective layer 8 has a thickness within a range of 10 Å to 200 Å. The color filter 9 has a thickness within a range of 1000 Å to 40000 Å and can be a color filter of RGB mode (Red, Green and Blue), RGBY mode (Red, Green, Blue and Yellow) or RGBW mode (Red, Green, Blue and White).

Figure 6:
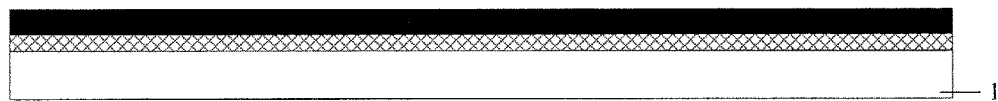
FIG. 6 is a diagram of forming a transflective film and a gate metal film on a base substrate in a process flow for manufacturing the array substrate as shown in FIG. 5.
Figure 7:
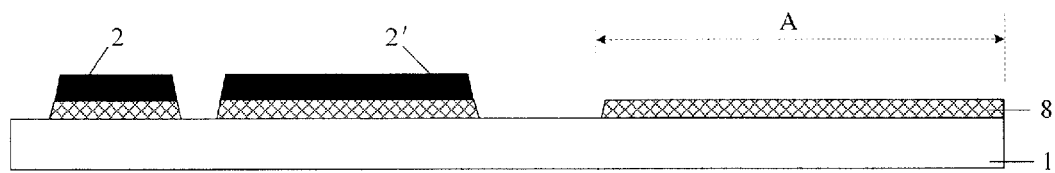
FIG. 7 is a structural diagram of framing patterns of gates of a thin film transistor structure and of a transflective layer on the base substrate in a process flow for manufacturing the array substrate as shown in FIG. 5.

According to another aspect of the present invention, a method for manufacturing the array substrate mentioned above is also provided, the method comprising:

Step S1: forming patterns of a transflective layer 8, a thin film transistor structure and a passivation layer 7 on a base substrate 1 to define a pixel unit on the base substrate 1. The step comprises the following:

As shown in FIGS. 6 and 7, a transflective thin film and a gate metal thin film are sequentially formed on the base substrate 1 (through a manner such as coating, spluttering and depositing and the like) and patterns of gates of a thin film transistor structure and of a transflective layer are formed by one patterning process (patterning process normally comprising photoresist coating, exposing, developing, etching, photoresist peeling and the like). For example, through a two-tone mask (such as a half tone mask or a gray tone mask), patterns of the first gate electrode, the second gate electrode of the thin film transistor structure and the transflective layer may be simultaneously formed. The transflective thin film is made of any one of silver, aluminum, molybdenum, copper, titanium, chromium and alloys thereof, has a transmittance within a range of 5% to 95%, and has a thickness within a range of 10 Å to 200 Å. Herein, as the transflective layer and the patterns of the first gate and the second gate are formed simultaneously through one patterning process, obviously, there is also a transflective layer under the first gate electrode and the second gate electrode, which is consistent with the patterns of the first gate electrode and the second gate electrode.

Figure 8:
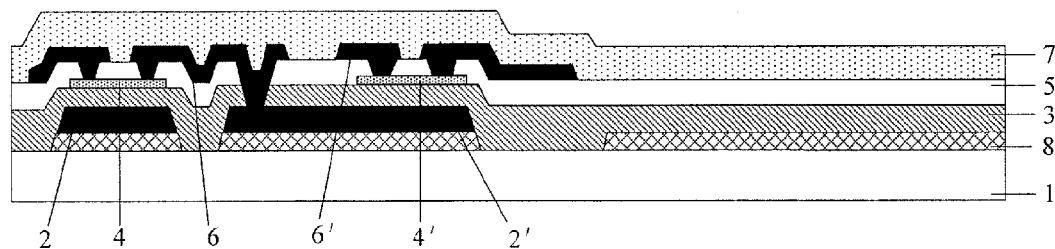
FIG. 8 is a structural diagram of forming a thin film transistor structure and a passivation layer on the base substrate in a process flow for manufacturing the array substrate as shown in FIG. 5.

Other layer structures of the thin film transistor structure are sequentially formed, to form the thin film transistor structure, mainly by forming respective film layers (which may employ manners such as coating, spluttering and depositing) and then forming patterns of the respective layers through a patterning process (patterning process normally comprising photoresist coating, exposing, developing, etching, photoresist peeling and the like). The step is substantially the same as that of the existing process for making an array substrate, and will not be elaborated herein. The substrate formed after the step is as shown in FIG. 8 which shows a structure of a pixel unit wherein the thin film transistor structure is provided in a non-pixel region and region A is the pixel region. The film transistor structure comprises a switching thin film transistor and a driving thin film transistor wherein, the switching thin film transistor is constituted of the first gate electrode 2, the gate insulation layer 3, the first active layer 4, the insulation layer 5 and the first source/drain layer 6 (including the layer of the first source electrode and the first drain electrode); the driving thin film transistor is constituted of the second gate electrode 2', the gate insulation layer 3, the second active layer 4', the insulation layer 5 and the second source/drain layer 6' (including the layer of the second source electrode and the second drain electrode). The passivation layer 7 is formed over the thin film transistor structure.

Figure 9:
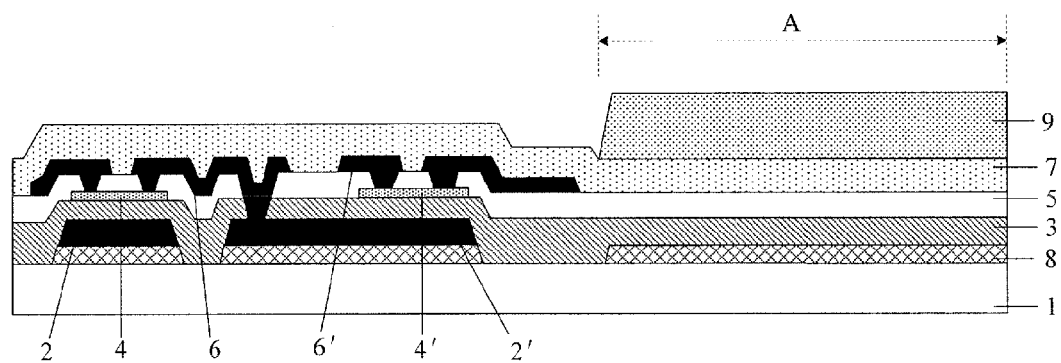
FIG. 9 is a structural diagram of forming a pattern of a color filter on the basis of the structure in FIG. 7.

Step S2: as shown in FIG. 9, patterns of the color filter 9 of different colors are formed in the pixel region A of the pixel unit. The color filters 9 of different colors have different thicknesses. The step comprising:

forming color filters 9 through a plurality of processes (for example, 3 processes for RGB), with each process forming a pattern of one filter of a color, and sequentially forming patterns of different color filters, so that patterns of the color filters 9 are formed. The color filters 9 are formed as below: forming a color filter of one color on the passivation layer 7 and forming a pattern of the color filter of this color in the pixel region A by a patterning process. Patterns of the color filters of other colors are formed sequentially in this manner, to form patterns of the color filters 9, and when patterns of the filters of each color are formed, the color filter of each color has different thicknesses, therefore color filters 9 of different colors finally faulted have different thicknesses. The color filter 9 has a thickness in a range of 1000 Å to 40000 Å. The color filter has a wide range of thickness and is provided in the microcavity structure. Thickness of the microcavity structure can be controlled through adjusting the thickness of the color filter, so that the microcavity structure in each pixel unit intensifies light with the same color as that of the color filter 9. Since color filters of the pixel units of different colors are formed in different steps, their thicknesses can be easily controlled separately and it is not needed to manufacture individually additional layers for a pixel of a certain color to control its thickness. Therefore, the array substrate according to the embodiment of the present invention can be easily manufactured at low cost.

Figure 10:
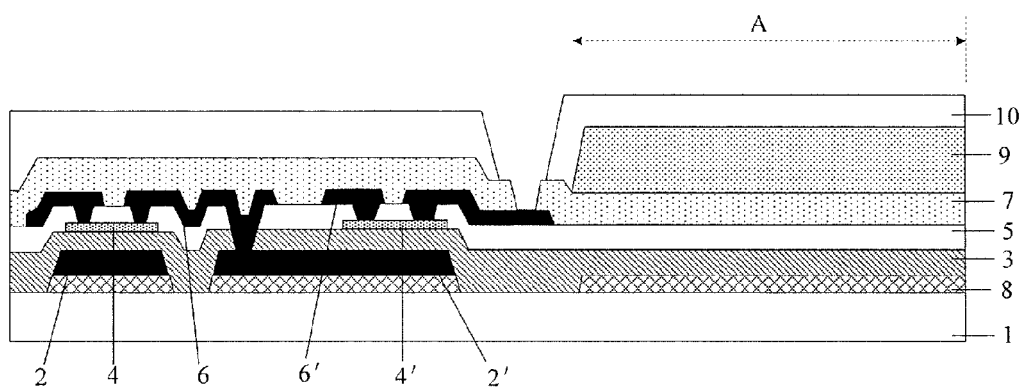
FIG. 10 is a structural diagram of forming a pattern of a resin layer on the basis of the structure in FIG. 9.

Step S3: forming the OLED in the pixel region A of the pixel unit, so that the color filters 9 being disposed between the OLED and the transflective layer 8. The step comprises:

Forming via holes by etching the passivation layer 7 through a patterning process, as shown in FIG. 10. To increase the spatial distance of the microcavity structure and further increase transmittance, it is also possible to form a resin layer 10 on the passivation layer 7 and on the color filters 9, and the via holes penetrate through the passivation layer 7 and the resin layer 10.

Figure 11:
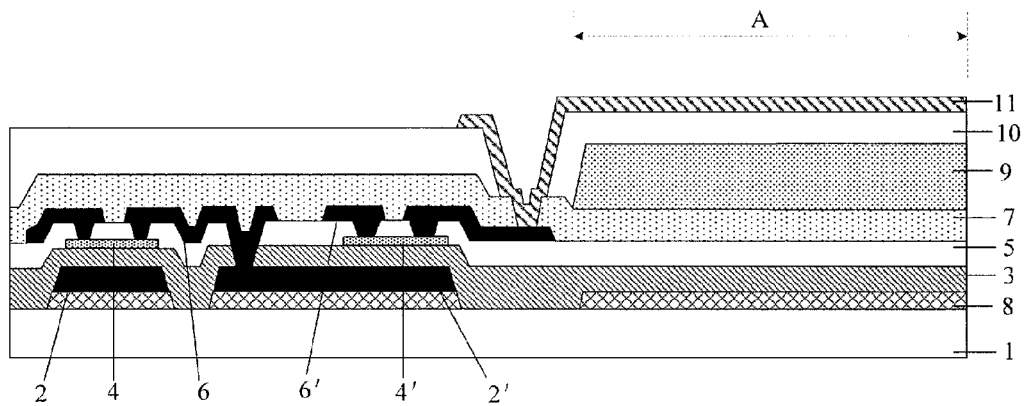
FIG. 11 is a structural diagram of forming a first electrode of an OLED on the basis of the structure in FIG. 10.

As shown in FIG. 11, a transparent conductive film is formed on the resin layer 10, and patterns of the first electrode 11 of the OLED are formed through a patterning process, so that the first electrode 11 is connected to the thin film transistor structure (the drain electrode of the driving thin film transistor) through the via holes.

Figure 12:
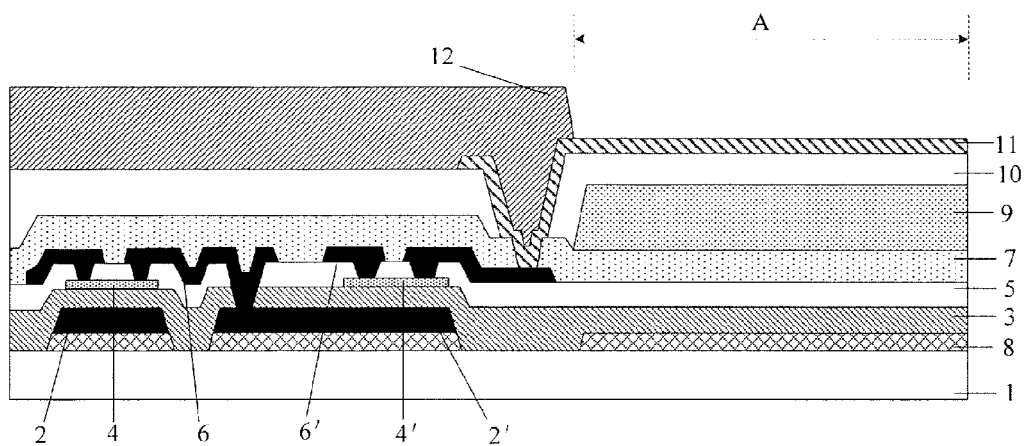
FIG. 12 is a structural diagram of forming a pattern of a pixel define layer on the basis of the structure in FIG. 11.

As shown in FIG. 12, an insulation film is formed on the resin layer 10 and the first electrode 11, a pattern of the pixel define layer 12 are formed by patterning the insulation film through a patterning process, in order to define position of the OLED to be formed in the pixel region A;

The organic light-emitting layer 13 is formed on the first electrode 11 and the pixel define layer 12 and the second electrode 14 of the OLED is formed on the organic light-emitting layer 13. Thus, the OLED is formed and the resultant array substrate is as shown in FIG. 5. The second electrode 14 for reflecting light is a reflective electrode, it can be made of a reflective material, Or, a reflective layer can be formed on the organic light-emitting layer 13, and then the second electrode can be formed on the reflective layer. Or, the second electrode 14 can be formed on the organic light-emitting layer 13 and a reflective layer is formed on the second electrode 14.

Embodiments of the present invention also provide a display device comprising the array substrate mentioned above. The display device may be: any product or component with a display function such as an electronic paper, an OLED panel, and OLED display, an OLED TV, a digital photo frame, a mobile, a laptop and the like.

The foregoing are merely exemplary embodiments of the invention, but are not used to limit the protection scope of the invention. The protection scope of the invention shall be defined by the attached claims.

The invention claimed is:

1. An array substrate comprising a base substrate and a plurality of pixel units disposed on the base substrate, each of the pixel units comprising:
a transflective layer formed on the base substrate;
a thin film transistor structure formed over the transflective layer;
an organic light-emitting diode disposed in a pixel region of the pixel unit and driven by the thin film transistor structure, and in a direction away from the base substrate, the organic light-emitting diode sequentially comprising a first electrode that is transparent, an organic light-emitting layer and a second electrode for reflecting light;
a color filter, disposed between the second electrode of the organic light-emitting diode and the transflective layer;
wherein the second electrode of the organic light-emitting diode and the transflective layer constitute a microcavity structure;
wherein the color filter is formed in the pixel region of the pixel unit and over a passivation layer, color filters of different colors have different thicknesses, and the first electrode of the organic light-emitting diode is disposed over the color filters; and
wherein the transflective layer is formed in the pixel region of the pixel unit and in a gate electrode region of the thin film transistor structure, the thin film transistor structure comprises a switching thin film transistor and a driving thin film transistor, and portions of the transflective layer in the gate electrode region of the thin film transistor structure are disposed under and in contact with the gate electrode of the switching thin film transistor and the gate electrode of the driving thin film transistor and have same sizes as patterns of the gate electrode of the switching thin film transistor and the gate electrode of the driving thin film transistor.

2. The array substrate according to claim 1, wherein, a drain electrode of the switching thin film transistor being connected to a gate electrode of the driving thin film transistor, a drain electrode of the driving thin film transistor being connected to the first electrode of the organic light-emitting diode.

3. The array substrate according to claim 2, wherein a passivation layer is formed on the thin film transistor structure, the organic light-emitting diode is formed over the passivation layer, and the first electrode is connected to the drain electrode of the driving thin film transistor through via holes in the passivation layer.

4. The array substrate according to claim 3, further comprising a resin layer disposed between the color filter and the first electrode, the first electrode being connected to the drain electrode of the driving thin film transistor through via holes penetrating the resin layer and the passivation layer.

5. The array substrate according to claim 1, further comprising a pixel define layer disposed in a region corresponding to the thin film transistor structure and over the first electrode.

6. The array substrate according to claim 1, wherein, the transflective layer is made of any one of silver, aluminum, molybdenum, copper, titanium, chromium or alloy of any two or more thereof and has a transmittance in a range of 5% to 95%.

7. The array substrate according to claim 1, wherein the transflective layer has a thickness in a range of 10 Å to 200 Å.

8. The array substrate according to claim 1, wherein, the color filter has a thickness in a range of 1000 Å to 40000 Å.

9. The array substrate according claim 1, wherein, the color filter is a color filter of RGB mode, RGBY mode or RGBW mode.

10. A display device including the array substrate according to claim 1.

* * * * *